(12) United States Patent
Haigh et al.

(10) Patent No.: US 6,265,653 B1
(45) Date of Patent: Jul. 24, 2001

(54) HIGH VOLTAGE PHOTOVOLTAIC POWER CONVERTER

(75) Inventors: Ronald E. Haigh, Arvada, CO (US); Steve Wojtczuk, Cambridge, MA (US); Gerard F. Jacobson; Karla G. Hagans, both of Livermore, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/458,234

(22) Filed: Dec. 9, 1999

Related U.S. Application Data

(60) Provisional application No. 60/111,899, filed on Dec. 10, 1998.

(51) Int. Cl.[7] .................. H01L 31/042; H01L 31/052; H01L 31/05

(52) U.S. Cl. .................. 136/249; 136/244; 136/246; 136/248; 136/256; 136/262; 257/432; 257/436; 257/443; 257/448; 257/461; 257/466; 250/396 R; 250/216; 250/227.11; 322/2 R; 323/906

(58) Field of Search .................. 136/244, 246, 136/248, 249 TJ, 249 MS, 256, 262; 257/432, 436, 443, 448, 461, 466; 250/396 R, 216, 227.11; 322/2 R; 323/906

(56) References Cited

U.S. PATENT DOCUMENTS

| | | | |
|---|---|---|---|
| 4,278,473 | * 7/1981 | Borden | 136/249 |
| 4,313,023 | 1/1982 | Stephens | 136/246 |
| 5,049,753 | 9/1991 | Flesner | 250/396 R |
| 5,196,690 | 3/1993 | Flesner et al. | 250/207 |
| 5,248,931 | 9/1993 | Flesner et al. | 322/2 R |
| 5,560,700 | * 10/1996 | Levens | 136/248 |
| 6,055,079 | * 4/2000 | Hagans et al. | 359/147 |

FOREIGN PATENT DOCUMENTS

| | | |
|---|---|---|
| 0 779 660 A2 | 6/1997 | (EP) . |
| WO96/11062 | 4/1996 | (WO) . |
| WO 98 49735 | 11/1998 | (WO) . |

OTHER PUBLICATIONS

Borden, "A Monolithic Series Connected Al.93Ga.07 As/GaAs Solar Cell Array," Conference Record, 14th IEEE Photovoltaic Specialists Conf., pp. 554–562, San Diego, CA, Jan. 7–10, 1980.*

Patent abstract of Japan, abstract for JP 04109882, date, Apr. 10, 1992.

* cited by examiner

Primary Examiner—Alan Diamond
(74) Attorney, Agent, or Firm—Alan H. Thompson

(57) ABSTRACT

An array of independently connected photovoltaic cells on a semi-insulating substrate contains reflective coatings between the cells to enhance efficiency. A uniform, flat top laser beam profile is illuminated upon the array to produce electrical current having high voltage. An essentially wireless system includes a laser energy source being fed through optic fiber and cast upon the photovoltaic cell array to prevent stray electrical signals prior to use of the current from the array. Direct bandgap, single crystal semiconductor materials, such as GaAs, are commonly used in the array. Useful applications of the system include locations where high voltages are provided to confined spaces such as in explosive detonation, accelerators, photo cathodes and medical appliances.

43 Claims, 3 Drawing Sheets

HIGH VOLTAGE PHOTOVOLTAIC POWER CONVERTER

REFERENCE TO PROVISIONAL APPLICATIONS TO CLAIM PRIORITY

This application claims priority in provisional application filed on Dec. 10, 1998, entitled "High Voltage Photovoltaic Power Converter" Ser. No. 60/111,899, by inventor(s) Ronald E. Haigh, Steve Wojtczuk, Gerard F. Jacobson, and Karla G. Hagans.

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to an array of photovoltaic cells, and more particularly to photovoltaic arrays that are illuminated with an optical homogenized laser beam.

2. Description of Related Art

Voltage transformers have usually been employed to increase voltage output where insufficient voltage is generated in a system.

Voltage generation from photovoltaic cells can be useful for several remote sensing applications. However, a single photovoltaic cell (diode) generates an insufficient output voltage to be useful in most applications. Fabricating arrays of photovoltaic cells monolithically (on a common substrate) using mass production techniques common to the semiconductor industry is normally preferable to the manual assembly and interconnection of individual diodes. Monolithically fabricated arrays can be adversely affected by parasitic electrical currents (e.g., photo-induced photocurrents) flowing between the individual diodes through the substrate reducing the usable current and voltage produced by the array.

Attempts to fabricate multiple electrically isolated photovoltaic cells in series have met with limited success. For instance, silicon-containing cells mounted on sapphire provide outputs of about 0.7 volts/diode (or cell). A limitation in voltage scaleup and forming a compact, integrated photocell array is excessive leakage current due to the parasitic electric fields as arrays of series diodes are placed in parallel to minimize footprint. The result is a collapse of the voltage across each component of the array, thereby degrading the overall voltage generated by the photocell(s).

A need exists for a high voltage photovoltaic power-induced converter that can be tailored to meet the voltage requirements of most sensing and other applications without the use of voltage transformers.

SUMMARY OF THE INVENTION

The invention is directed to an array of photovoltaic cells connected in series, yet each cell being electrically isolated from others of the array located on a monolithic semi-insulating substrate. An interconnection scheme for the cells includes interconnected arrays of cells, interconnected substrates, and reflective coatings on the substrate between each cell. The reflective coatings include a metal reflective layer that covers an insulator material normally in contact with the semi-insulating substrate, and such coatings can serve as an interconnect for the p-n or n-p junction between cells. The array materials normally contain single crystal, direct bandgap semiconductor materials, such as Group III-V composites, e.g., GaAs.

A plurality of interconnected arrays are usually illuminated in a system of the invention that includes a source of laser energy which is transmitted via an optical fiber through an optical homogenizer to create a uniform flat top optical beam profile for illuminence upon the array of cells to produce the photoconductive or photo-induced electrical current having high voltage. Preferably the array is rectangular, and optimally square, to create a uniform potential gradient across the array.

An advantage of the invention is the elimination of photoconductive current in the semi-insulating substrate by the intercell reflective coatings including insulators, thus preventing the shunting of each array and/or the substrate, i.e, enhancing efficiency. The invention provides an essentially wireless system that feeds a relatively low voltage laser energy source through optic fiber, casts the uniform beam profile upon the photovoltaic cell array and prevents stray electrical signals prior to use of the high voltage current from the array. Useful applications of the system include locations where high voltages are provided to confined spaces such as in explosive detonation, accelerators, photo cathodes and medical appliances.

DETAILED DESCRIPTION OF THE INVENTION

Figure 1:
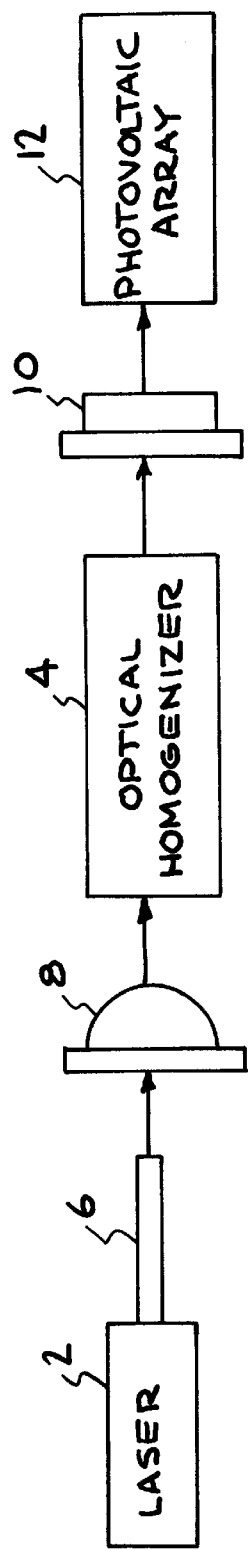
FIG. 1 is a schematic of a system of the invention including an optical fiber transmitting a laser that is homogenized to a flat beam profile and illuminated on an array of photovoltaic cells.

The invention relates to a system for increasing a low voltage optical energy source to high voltage electrical energy. As shown in general schematic FIG. 1, the system includes a source of laser energy 2, and means for transmitting the laser energy to an optical homogenizer 4, such as through optic fiber 6. The optical homogenizer is used for converting the laser energy having a Gaussian beam profile 8 to a uniform, flat top beam profile 10. The system includes an array 12 of independent photovoltaic cells interconnected in series, typically in independent columns, on a surface of a semi-insulating substrate. The uniform, flat top beam profile 10 is illuminated onto array 12 to produce photoconductive electrical currents greater than 1 nanoAmpere and output voltages greater than that of the input voltages of the laser energy.

The source of laser energy is capable of generating any voltage, such as greater than about 0.1 volt, however, the voltage is usually about 1 to about 5 volts. Furthermore, the laser energy is normally capable of producing power from about 1 milliwatt up to the damage threshold of an optic fiber transmitter, usually up to about 100 Watts. The wave length of the laser energy is typically from about 600 nm to about a micron, but preferably a laser from about 700 to about 900 nm, and most preferably from about 780 to about 870 nm.

The laser energy energy can be transmitted from the source of laser energy to the optical homogenizer by any optical or light transmission means available in the art. Preferably such laser energy is transmitted by optic fiber, e.g., optic fiber cable.

The optical homogenizer is adapted to provide uniform illumination onto the array. Achieving good energy transfer to the array, i.e., application load, requires uniform cell characteristics and a uniform photocurrent in each cell of the array, otherwise the photocurrent through the series is limited to the cell with the smallest photo-generated current. A uniform, flat top laser beam profile useful in the invention has greater than 90%, preferably greater than 93%, and most preferably greater than 99% uniformity. The optical homogenizer comprises a multi-level diffractive optical element, or an internally reflective element, although a fiber optic diffuser is preferred.

Figure 2:
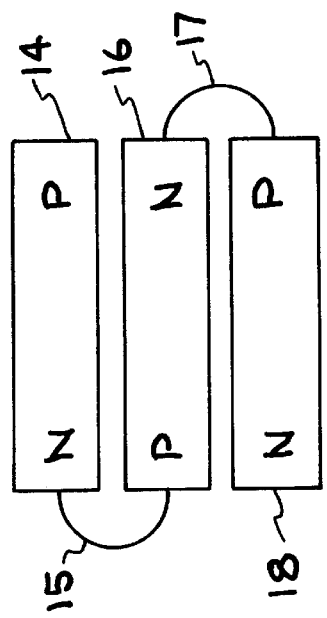
FIG. 2 illustrates a vertical cell interconnection scheme.

Stacking independent photovoltaic cells in series can effect generation of a much higher output voltage than is obtainable from a single photovoltaic cell. Such stacking can create a uniform potential gradient across the array and minimizes the potential between adjacent cells, thereby mitigating high voltage breakdown in the array. To maximize the output power from the array in conjunction with the uniform, flat top laser beam illuminence, the aspect ratio of the cells is a square, although rectangular and other regular geometric shaped arrays are useful. The series of photovoltaic cells, particularly the vertical cells, can be interconnected on the ends of such cells by alternating the n and p sides of a cell having doped semiconductors having at least one n-p or p-n junction. FIG. 2 illustrates an interconnection scheme wherein an n side of a first cell 14 is fist connected via interconnect 15 to a p side of a second cell 16 and the n side of the second cell 16 also connected to a p side of a third cell 18 via interconnect 17, and so on for a plurality of independent photovoltaic cells containing doped semiconductor materials that are attached to a surface of the semi-insulating substrate (not shown). The cells are usually etched so as to electrically isolate each cell from the other, although any mode of physically separating such cells on the substrate may be employed. The conventional fabrication techniques resulting in epitaxial growth of the semiconductor layers of the cells and substrate are a preferred mode of fabrication of the array, e.g., an array having GaAs or AlAs semiconductor materials grown by metallorganic chemical vapor deposition (MOCVD) or molecular beam epitaxy (MBE).

The array is positioned to receive the uniform, flat top beam from the optical homogenizer and the photovoltaic cells contain single crystal semiconductors having a direct bandgap of at least about 1 Preferred semiconductors utilized in the cells include Group III-V composite materials such as GaAs and AlGaAs. The semi-insulating substrate can contain any material on which the electrically isolated, independent photovoltaic cells can be functionally mounted or attached, including Group III-V composite material from which the semiconductor materials of the cells are prepared, e.g., GaAs. Other substrate examples include glass, undoped semiconductor materials and ceramics.

Figure 3:
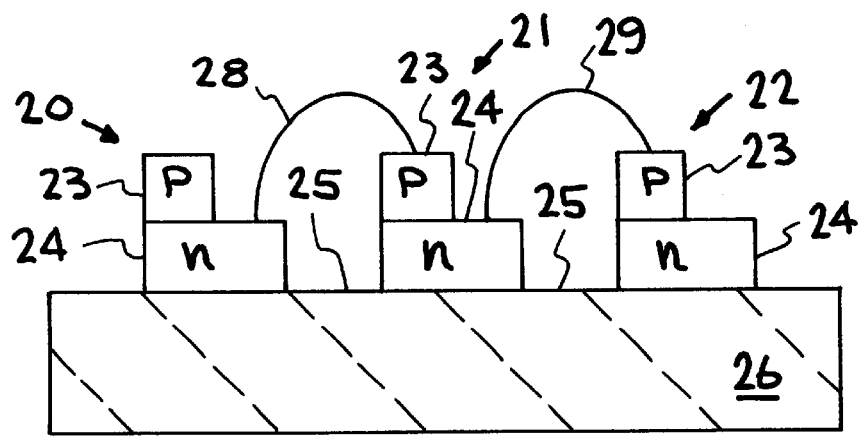
FIG. 3 illustrates a portion of an array of photovoltaic cells interconnected on a semi-insulating substrate.

As shown in FIG. 3, the electrically isolated photovoltaic cells 20, 21 and 22 can be etched as independent mesas (such as by epitaxial growth), each having p doped semiconductor 23 layered onto n doped semiconductor 24, on a common semi-insulating substrate 26. Interconnects 28 and 29 connect the n side of cell 20 to the p side of cell 21 and the n side of cell 21 to the p side of cell 22, respectively, and such interconnection repeated throughout the series of the array. When the array is illuminated the photons can be absorbed in the semi-insulating substrate surface 25 that is exposed (often as a result of mesa etch processing steps) between the cells (e.g., mesa cells). The absorbed photons can induce photoconductive currents between the cells which tend to shunt the cells, thus reducing desired voltage and current output from the array.

Figure 4:
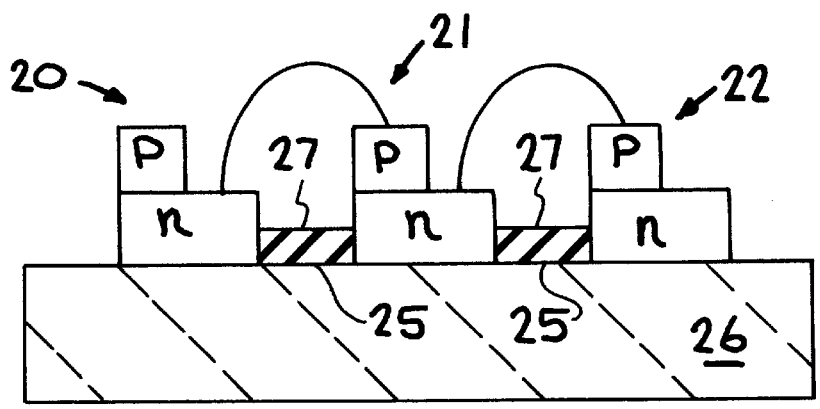
FIG. 4 illustrates an array of independent photovoltaic cells having a reflective coating located between the cells.

In a feature of the invention, an absorptive or reflective material can be grown or deposited on the semi-insulating substrate regions of the array, thus shielding the substrate from photons and eliminating the photoconductive current in the substrate. As shown in FIG. 4, the formerly exposed surface 25 of the semi-insulating substrate 26 between the independent cells, such as between cells 20 and 21 and between cells 21 and 22, are covered by a reflective coating 27. Such a coating contains semi-optically opaque, insulator material to reduce photon absorption into the semi-insulating substrate.

Figure 5:
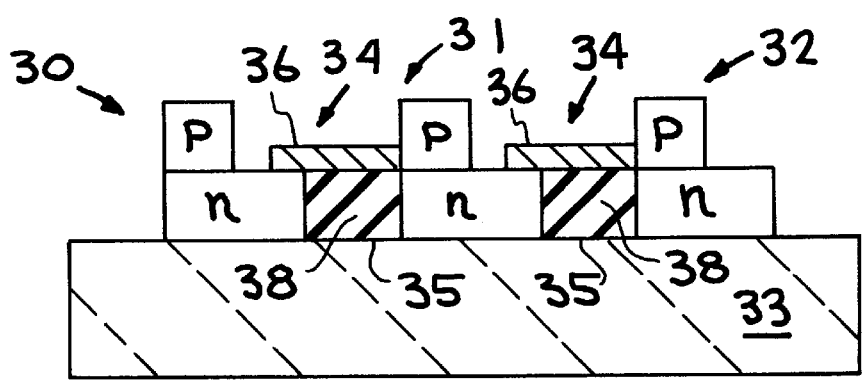
FIG. 5 illustrates an array of independent photovoltaic cells having a reflective coating that includes a metal reflective layer and an insulator located between the cells.

In a preferred embodiment of the invention, a reflective coating is placed over an insulator layer, usually adjacent to the exposed surface of a semi-insulating substrate common to all or a majority of the cells. The reflective coating can contain a metal (conductive) reflective layer and an insulator material. FIG. 5 illustrates an array of cells 30, 31 and 32 on a semi-insulating substrate 33 wherein the reflective coating 34 between the cells and covering a substrate surface 35 contains at least one metal reflective layer 36 and at least one insulator material layer 38. Since the independent photovoltaic cells are cells that are electrically isolated from each other, the cells are connected in series to each other by conductive connectors such as elemental metal-containing material as could be employed for connectors in FIGS. 2, 3 and 4. However, in such a preferred embodiment as shown in FIG. 5, the electrically conductive portion of reflective coating 34, i.e., metal reflective layer 36, can provide a dual function for the array. Aside from contributing to the prevention of photon absorption to substrate 33 during illumination (and consequent parasitic photocurrents and voltage degradation), metal reflective layer 36 can serve as an interconnect from the n side of cell 30 to the p side of cell 31, and the n side of cell 31 to the p side of cell 32, etc., thus creating the in series connections for the array of cells.

Although essentially any optically opaque material can be employed in the reflective coating, useful metals include gold, copper, aluminum, titanium, platinum, iron, indium, tungsten, chromium, vanadium, nickel and lead. The insulator material in the reflective coating can contain an organic material such as polyimide, PMMA, polyethylene, nylon, polyvinyl chloride, polystyrene, polyacrylate, polyvinylalcohol acetate, and tetrafluoroethylene (TFE) fluorocarbon polymer and fluorinated ethylene-propylene (FEP) resin, i.e., Teflon, and/or an inorganic material such as silicon dioxide, silicon nitride, aluminum oxide, aluminum nitride, boron nitride, titanium dioxide and titanium nitride.

The array is capable of generating any output voltage, depending upon the number of interconnected cells. The output voltage approximates the sum of the individual cell voltages when the array is uniformily illuminated with energy above the bandgap energy of the photovoltaic material. In general, 2 or more cells (diodes) are interconnected to efficiently generate voltage output; however, in the arrays useful for the invention at least 16 cell, preferably at least 90 cells and more preferably at least 1000 cells are interconnected to generate the desired voltage output. For the preferred doped semiconductors of the cells having direct bandgap energies above about 1, such voltage outputs of the array are greater than 1 volt, usually greater than 16 volts, preferably great than about 90 volts, and more often greater than about 1000 volts. In several commercial applications, about 1,000 to about 20,000 volts can be generated. Furthermore, the array is capable of generating electrical current from about 1 nanoAmpere to about 1 milliAmpere, or in some cases up to about 20 milliAmperes.

Figure 6:
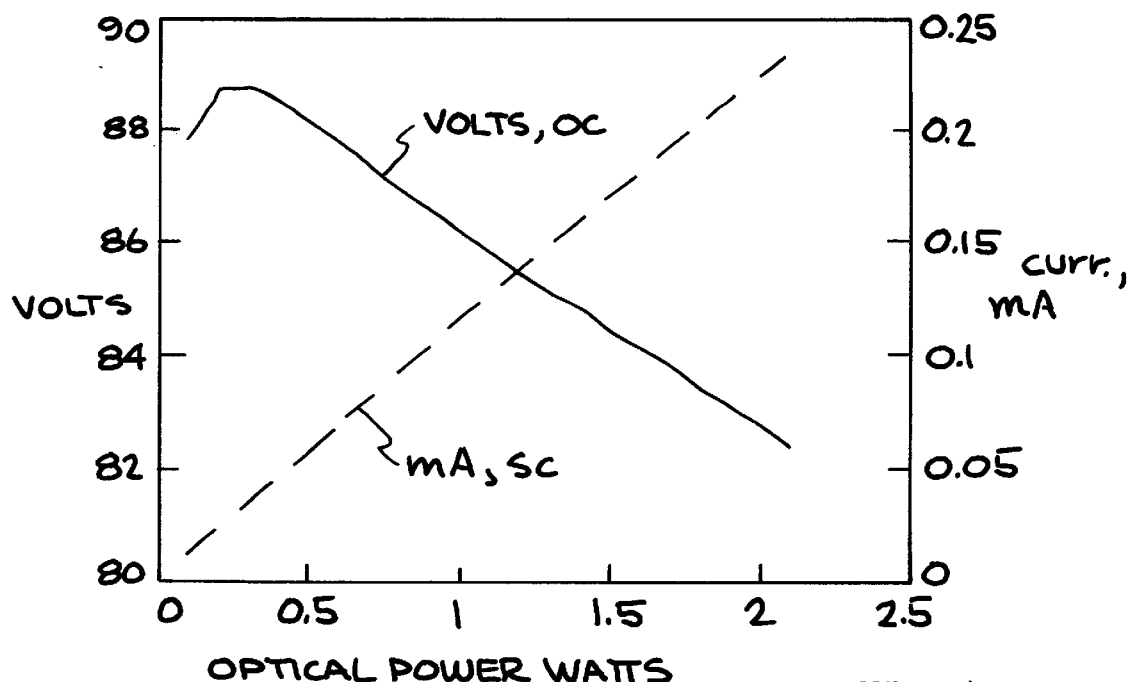
FIG. 6 shows a plot of output voltage and current from an array of nonindependent photovoltaic cells.
Figure 7:
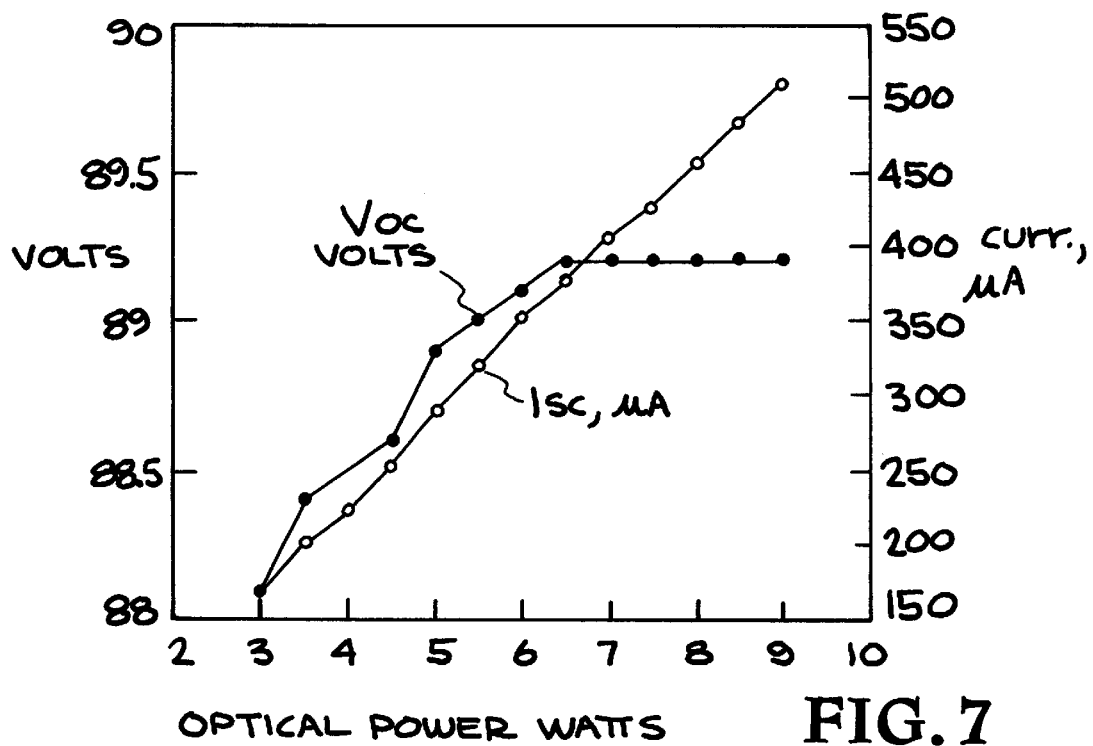
FIG. 7 shows a plot of output voltage and current from an array of independent photovoltaic cells.

In an experimental run (employing the system scheme of FIG. 1) utilizing a 2 by 50 array of GaAs-containing photovoltaic cells on a semi-insulating GaAs substrate having a reflective coating containing a semi-opaque, insulator material between the cells in the same manner as shown in FIG. 4, up to about 2 watts of laser energy is transmitted through an optic fiber and uniformly illuminated (via an optical homogenizer) over the array. As illustrated in FIG. 6, a maximum voltage output of about 88.7 volts providing about 0.035 milliAmperes is exhibited during operation of the system. Without a reflective metal layer over the opaque insulator material of the reflective coating, the efficiency of the system is shown to be functional, but relatively low.

In another experimental run similar to that above, the efficiency of the system is considerably higher. In this system, independent columns of a 1×100 photocell array having adjacent photocells located as shown in FIG. 5, is utilized having a reflective coating between the cells containing a layer of insulator material containing GaAs under a metal reflective layer of gold. Over a power range of about 2 to 9 watts, a voltage output of about 89.2 volts is achieved and a current ranging from about 380 to about 500 microAmperes is generated. Such surprising results illustrate the effectiveness of a reflective coating between the cells, particularly when the insulator material can reduce and/or essentially eliminate stray electrical photocurrents migrating in the semi-insulating substrate.

The electrically isolated, optically controlled power supplies can be used in a variety of applications, such as for the generation of high voltage power inside hermetically sealed systems. The invention is useful in any application wherein an optical fiber cable can replace an electrical cable, wire or other transmission line that delivers high voltage at a remote location from an energy source of low voltage. The essentially wireless system is useful for enhanced voltages in photo cathodes, medical appliances, including electrophoretic or dielectrophoretic devices, and particle accelerators. In a preferred use for remotely detonating explosive, the inventive system can essentially prevent or eliminate stray electrical signals that cause undesired or premature ignition of the explosive (or other hazardous) materials prior to desired detonation.

Changes and modifications in the specifically described embodiments can be carried out without departing from the scope of the invention which is intended to be limited only by the scope of the claims.

We claim:

1. An array of photovoltaic cells comprising:
   a semi-insulating substrate comprising a Group III-V composite;
   at least 90 independent photovoltaic cells containing doped single crystal semiconductor materials at least one of which has a direct bandgap of at least 1, said cells attached to a surface of said semi-insulating substrate, said doped semiconductors of a first independent photovoltaic cell having an n side of an n-p junction or p-n junction interconnected to a p side of an n-p junction or p-n junction of a second independent photovoltaic cell; and
   an optically opaque reflective coating covering said surface of said semi-insulating substrate between said independent photovoltaic cells, and
   wherein said reflective coating comprises a metal reflective layer interconnecting said n side and said p side in said independent photovoltaic cells and an insulator material.

2. The array defined in claim 1 wherein said reflective coating comprises said insulator material between an outer metal reflective layer and said surface of said semi-insulating substrate.

3. The array defined in claim 2 wherein said semi-insulating substrate and said doped semiconductor materials comprise a single crystal material.

4. The array defined in claim 1 wherein said cells comprise mesa structures on said surface and said cells are not in physical contact with each other.

5. The array defined in claim 1 wherein a p-doped semiconductor is in physical contact with said semi-insulating substrate.

6. The array defined in claim 1 wherein an n-doped semiconductor is in physical contact with said semi-insulating substrate.

7. The array defined in claim 1 wherein said semi-insulating substrate comprises a single crystal Group III-V composite.

8. The array defined in claim 1 wherein said photovoltaic cells comprise at least 1,000 cells.

9. The array defined in claim 1 wherein said semi-insulating substrate comprises GaAlAs.

10. The array defined in claim 1 wherein said reflective coating comprises a metal reflective layer that is optically opaque and said insulator material.

11. The array defined in claim 1 wherein said doped semiconductors of a first independent photovoltaic cell having an n side of an n-p junction are interconnected to a p side of an n-p junction of a second independent photovoltaic cell by said metal reflective layer.

12. The array defined in claim 1 wherein said photovoltaic cells comprise n-p-n junctions or p-n-p junctions.

13. The array defined in claim 1 wherein said cells are stacked vertically and connected in series.

14. The array defined in claim 1 wherein said reflective coating comprises a metal selected from the group consisting of gold, copper, aluminum, titanium, platinum, iron, indium, tungsten, chromium, vanadium, nickel and lead.

15. The array defined in claim 1 wherein said insulator material comprises an organic material selected from the group consisting of polyimide, PMMA, polyethylene, nylon, polyvinyl chloride, polystyrene, polyacrylate, polyvinylalcohol acetate, tetrafluoroethylene (TFE) fluorocarbon polymer and fluorinated ethylene-propylene (FEP) resin.

16. The array defined in claim 1 wherein said insulator material comprises an inorganic material selected from the group consisting of silicon dioxide, silicon nitride, aluminum oxide, aluminum nitride, boron nitride, titanium dioxide and titanium nitride.

17. The array defined in claim 1 wherein said semi-insulating substrate comprises GaAs.

18. A system for increasing a low voltage optical energy source to high voltage electrical energy, said system comprising:
   a source of laser energy;

an optical homogenizer;

means for transmitting said laser energy to said optical homogenizer;

an array of independent photovoltaic cells interconnected in series on a surface of a semi-insulating substrate, said cells comprising single crystal semiconductors having a direct bandgap of at least about 1, said array positioned to receive optical energy from said optical homogenizer, and wherein said independent photvoltaic cells are isolated from each other by a reflective coating containing a metal reflective layer and an insulator material.

19. The system defined in claim 18 wherein said array has a rectangular or square shape.

20. The system defined in claim 18 wherein said optical homogenizer comprises a multi-level diffractive optical element, an optic fiber diffuser or an internally reflective element.

21. The system defined in claim 18 wherein said optical homogenizer is adapted to provide uniform illumination to said array.

22. The system defined in claim 18 wherein said optical homogenizer comprises a fiber optic diffuser.

23. The system defined in claim 18 wherein said means for transmitting said laser energy comprise fiber optic cable.

24. The system defined in claim 18 wherein said source of laser energy is capable of generating about 1 to about 5 volts.

25. The system defined in claim 18 wherein said source of laser energy is capable of producing power from about 1 milliWatt to about 100 Watts.

26. The system defined in claim 18 wherein said array is capable of generating about 90 to about 20,000 volts.

27. The system defined in claim 18 wherein said array is capable of generating electrical current from about 1 nanoAmpere to about 20 milliAmperes.

28. A method for converting low voltage laser power to high voltage photovoltaic power, said method comprising:

transmitting laser energy through a fiber optic to an optical homogenizer; and illuminating a uniform laser beam from said optical homogenizer onto an array of independent photovoltaic cells arranged in series on a semi-insulating substrate having a reflective coating on said substrate between said cells.

29. The method of claim 28 wherein said reflective coating comprises a metal reflective layer and an insulator material.

30. The method of claim 29 wherein said insulator material is adjacent said semi-insulating substrate.

31. The method of claim 30 wherein said cells comprise doped semiconductor materials having a direct bandgap of at least about 1.

32. The method of claim 31 wherein said doped semiconductor materials comprise GaAs or GaAlAs.

33. The method of claim 28 wherein said optical homogenizer comprises a multi-level diffractive optical element, an optic fiber diffuser or an internally reflective element.

34. The method defined in claim 28 wherein said laser energy comprises about 1 to about 5 volts.

35. The method defined in claim 28 wherein said laser energy comprises power from about 1 milliWatt to about 100 Watts.

36. The method defined in claim 28 wherein said array generates about 90 to about 20,000 volts.

37. The method defined in claim 28 wherein said array generates electrical current from about 1 nanoAmpere to about 20 milliAmperes.

38. The method defined in claim 28 wherein said cells are stacked vertically and connected in series.

39. The method defined in claim 28 wherein said reflective coating comprises a metal selected from the group consisting of gold, copper, aluminum, titanium, platinum, iron, indium, tungsten, chromium, vanadium, nickel and lead.

40. The method defined in claim 29 wherein said insulator material comprises an organic material selected from the group consisting of polyimide, PMMA, polyethylene, nylon, polyvinyl chloride, polystyrene, polyacrylate, polyvinylalcohol acetate, tetrafluoroethylene (TFE) fluorocarbon polymer and fluorinated ethylene-propylene (FEP) resin.

41. The method defined in claim 29 wherein said insulator material comprises an inorganic material selected from the group consisting of silicon dioxide, silicon nitride, aluminum oxide, aluminum nitride, boron nitride, titanium dioxide and titanium nitride.

42. The method defined in claim 28 wherein each of said cells generates more than 1 volt.

43. The method defined in claim 28 wherein said laser energy has a wave length from about 700 to about 900 nm.

* * * * *